United States Patent [19]

Eckstein et al.

[11] Patent Number: 5,310,583
[45] Date of Patent: May 10, 1994

[54] VAPOR PHASE DEPOSITION OF HYDROGEN SILSESQUIOXANE RESIN IN THE PRESENCE OF NITROUS OXIDE

[75] Inventors: Marie N. Eckstein; David S. Ballance, both of Midland, Mich.

[73] Assignee: Dow Corning Corporation, Midland, Mich.

[21] Appl. No.: 970,444

[22] Filed: Nov. 2, 1992

[51] Int. Cl.$^5$ ............................................. B05D 3/06
[52] U.S. Cl. .................................. 427/575; 427/255.3; 427/255.7; 427/578
[58] Field of Search .................... 427/226, 228, 255.6, 427/380, 387, 255.3, 255.7, 575, 578

[56] References Cited

U.S. PATENT DOCUMENTS

| | | | |
|---|---|---|---|
| 3,615,272 | 10/1971 | Frye et al. | 23/366 |
| 4,239,811 | 12/1980 | Kemlage | 427/255 X |
| 4,756,977 | 7/1988 | Haluska et al. | 428/704 |
| 4,808,653 | 2/1989 | Haluska et al. | 524/398 |
| 4,911,992 | 3/1990 | Haluska et al. | 427/380 X |
| 4,973,526 | 11/1990 | Haluska | 428/697 |
| 4,999,397 | 3/1991 | Weiss et al. | 524/755 |
| 5,010,159 | 4/1991 | Bank et al. | 528/23 |
| 5,063,267 | 11/1991 | Hanneman et al. | 524/284 |
| 5,165,955 | 11/1992 | Gentle | 427/402 X |

OTHER PUBLICATIONS

Desu et al., J. Electrochem. Soc., vol. 139, No. 9, Sep. 1992, Low Temperature CVD of SiO$_2$ Films Using Novel Precursors.

*Primary Examiner*—Michael Lusignan
*Attorney, Agent, or Firm*—Roger E. Gobrogge

[57] ABSTRACT

Silicon and oxygen containing coatings are deposited by the chemical vapor deposition of hydrogen silsesquioxane in an environment comprising nitrous oxide.

13 Claims, No Drawings

VAPOR PHASE DEPOSITION OF HYDROGEN SILSESQUIOXANE RESIN IN THE PRESENCE OF NITROUS OXIDE

BACKGROUND OF THE INVENTION

The present invention relates to the deposition of a high quality coating containing silicon and oxygen from vaporized hydrogen silsesquioxane resin wherein the formed coating has minimal impurity from incomplete oxidation. The process comprises introducing the hydrogen silsesquioxane vapor into a deposition chamber containing the substrate to be coated and containing a reactive environment comprising nitrous oxide, and then inducing reaction of the vapor to form the coating.

Silica vapor deposition methods in a reactive environment comprising nitrous oxide ($N_2O$) are known in the art and many are currently used in industry. Typically, such deposition methods involve decomposing a monomeric silicon source (e.g., $SiH_4$, $SiH_2Cl_2$. etc.) in the presence of nitrous oxide to form a silicon dioxide dielectric coating.

Kemlage in U.S. Pat. No. 4,239,811 teaches a low pressure vapor deposition method which deposits silicon dioxide coating by reacting monomeric chlorosilanes with nitrous oxide in the presence of oxygen. Kemlage found that the oxygen input produces silicon dioxide layers which are more resistent to degradation during subsequent oxidation cycles. This patent, however, only describes the use of monomeric silane compounds with nitrous oxide.

The use of hydrogen silsesquioxane resins in solution to form coatings is likewise known in the art. For instance, Haluska et al. in U.S. Pat. No. 4,756,977 teach the use of hydrogen silsesquioxane to form ceramic coatings on substrates. Similarly. Haluska et al. in U.S. Pat. No. 4,808,653 teach the use of hydrogen silsesquioxane in combination with other metal oxide precursors to form ceramic coatings on substrates. These patents, however, only describe the use of the resin in solution.

Gentle, U.S. Pat. application No. 07/706,464, filed 5/28/91, now allowed, describes the use of vaporized low molecular weight hydrogen silsesquioxane for the deposition of a silicon and oxygen containing coating on a substrate. The reactive environment claimed therein included ammonia, air, oxygen, and amines. The reference, however, did not teach that low molecular weight hydrogen silsesquioxane can be used with nitrous oxide in the process claimed herein.

Ballance et al. in U.S. Pat. application No. 07/912,436, filed 7-13-92 and assigned to the same assignee hereof, describe curing hydrogen silsesquioxane resin with nitrous oxide. This application, however, is limited to curing the resinous polymer as compared to the vaporized species claimed herein.

The present inventors have now unexpectedly discovered that the reaction of nitrous oxide with gaseous, low molecular weight hydrogen silsesquioxane in conventional vapor deposition techniques can form high purity silicon and oxygen containing coatings.

SUMMARY OF THE INVENTION

The present invention describes a method of depositing a coating containing silicon and oxygen on a substrate. The method comprises introducing a gas comprising hydrogen silsesquioxane into a deposition chamber containing the substrate and a reactive environment comprising nitrous oxide. Reaction of the gas is then induced to form the coating.

DETAILED DESCRIPTION OF THE INVENTION

The present invention is based on the discovery that the reaction of nitrous oxide with volatile fractions of hydrogen silsesquioxane resin can form high purity coatings on various substrates. The coatings produced by the techniques described herein are valuable as protective and dielectric layers on substrates such as electronic devices.

Reaction of gaseous species is well known in the art. In the present invention, vaporized H-resin is reacted with the nitrous oxide to deposit the desired coating via a simple thermal vapor deposition technique. The inventor found that nitrous oxide is not only an effective oxidizing agent of the H-resin, but also is an effective agent in producing high purity product coatings by ensuring complete oxidation.

H-resin is used in this invention to describe a variety of hydridosilane resins having units of the structure $HSi(OH)_x(OR)_yO_{z/2}$ in which each R is independently an organic group which, when bonded to silicon through the oxygen atom, forms a hydrolyzable substituent, $x=0-2$, $y=0-2$, $z=1-3$, and $x+y+z=3$. These resins may be either fully condensed ($x=0, y=0$ and $z=3$) or they may be only partially hydrolyzed (y does not equal 0 over all the units of the polymer) and-/or partially condensed (x does not equal 0 over all the units of the polymer). Although not represented by this structure, various units of these resins may have either zero or more than one Si-H bond due to various factors involved in their formation and handling. Exemplary of substantially condensed H-resins (less than about 300 ppm silanol) are those formed by the process of Frye et al. in U. S. Pat. No. 3.615,272 which is incorporated herein by reference. This polymeric material has units of the formula $(HSiO_{3/2})_n$ in which is generally 8-1000. The preferred resin has a number average molecular weight of from about 800-2900 and a weight average molecular weight of between about 8000-28,000 (obtained by GPC analysis using polydimethylsiloxane as a calibration standard).

Exemplary H-resin which may not be fully condensed include those of Bank et al. in U.S. Pat. No. 5,010,159. or those of Weiss herein by reference. Exemplary H-resin which is not fully hydrolyzed or condensed is that formed by a process which comprises hydrolyzing a hydrocarbonoxy hydridosilane with water in an acidified oxygen-containing polar organic solvent.

The above soluble hydridosilane resins are then fractionated to obtain the low molecular weight species which can be volatilized in the deposition process of this invention. Any conventional technique for fractionating the polymer can be use herein. Particularly preferred, however is the use of a variety of fluids at, near or above their critical point. This process is described in U.S. Pat. No. 5.063,267 which is hereby incorporated by reference. The process described therein comprises (1) contacting the H-resin with a fluid at, near or above its critical point for a time sufficient to dissolve a fraction of the polymer (2) separating the fluids containing the fraction from the residual polymer; and (3) recovering the desired fraction.

Specifically, the application describes charging an extraction vessel with a sample of H-resin and then passing an extraction fluid through the vessel. The extraction fluid and its solubility characteristics are controlled so that only the desired molecular weight fractions of H-resin are dissolved. The solution with the desired fractions of H-resin is then removed from the vessel leaving those H-resin fractions not soluble in the fluid as well as asy other insoluble materials such as gel or contaminants.

The desired H-resin fraction is then recovered from the solution by altering the solubility characteristics of the solvent and, thereby, precipitating out the desired fraction. These precipitates are then merely collected in a separation chamber by a process such as simple filtration.

The extraction fluid used in this process includes any compound which, when at, near or above its critical point, will dissolve the fraction of H-resin desired and not dissolve the remaining fractions. Additional consideration, however, is usually given to the critical temperature and pressure of the solvent compound so that unreasonable measures are not necessary to reach the appropriate point. Examples of specific compounds which are functional include, but are not limited to, carbon dioxide and most low molecular weight hydrocarbons such as ethane and propane.

By such methods, one can recover the desired fraction of H-resin. Other equivalent methods however, which result in obtaining the fractions described herein are also contemplated. For instance, methods such as solution fractionation or sublimation may also function herein.

The preferred fraction of H-resin to be used in the process of this invention is one which can be volatilized under moderate temperature and/or vacuum conditions. Generally such fractions are those in which at least about 75 % of the species have a molecular weight less than about 2000. Preferred herein, however, are those fractions in Which at least about 75 % of the species have molecular weight less than about 1600, with those fractions in which at least about 75 % of the species have a molecular weight between about 400 and 1000 (T8-T16) being particularly preferred. Additionally, it is contemplated that broad molecular weight materials may be used herein as the source of H-resin vapor. Volatilization of such material, however, often leaves a residue comprising nonvolatile species.

Once the desired fraction of H-resin is obtained, it is vaporized and introduced into a deposition chamber containing the substrate to be coated. Vaporization may be accomplished by heating the H-resin sample above its vaporization point, by the use of vacuum, or by a combination of the above. Generally, vaporization may be accomplished at temperatures in the range of 50°-300° C. under atmospheric pressure or at lower temperature (near room temperature) under vacuum.

The amount of H-resin vapor used in the process of this invention is that which is sufficient to deposit the desired coating. This can vary over a wide range depending on factors such as the desired coating thickness, the area to be coated, etc. In addition, the vapor may be used at nearly an concentration desired. If dilute vapor is to be used, it may be combined with nearly any compatible gas such as air, argon or helium.

The vaporized H-resin is then reacted in an environment comprising nitrous oxide to deposit the coating on the substrate. Reaction of gaseous species is well known in the art and any conventional chemical vapor deposition technique can be used herein. For example, methods such as thermal chemical vapor deposition (CVD) and low pressure chemical vapor deposition (LPCVD), subatmospheric chemical vapor deposition (SACVD) i.e.. less than one atmosphere), plasma enhanced chemical vapor deposition (PECVD), electron cyclotron resonance (ECR), and jet vapor deposition, or any similar technique may be used. These processes involve the addition of energy (in the form of heat, etc.) to the vaporized species to cause the desired reaction.

In thermal chemical vapor deposition, the deposition chamber is filled with nitrous oxide reactive environment. The high purity coating is deposited by passing a stream of the vaporized H-resin over a heated substrate. When the H-resin vapor contacts the hot surface, it reacts and deposits the coating. Substrate temperatures in the range of about 100°-1000° C. are sufficient to form these coatings in several minutes to several hours, depending on the thickness desired. No pressurization of the deposition chamber is necessary in the CVD process.

In PECVD, the vaporized H-resin is reacted by passing it through a plasma field. The reactive species thereby formed are then focused at the substrate and readily adhere. Generally, the advantage of this process over thermal CVD is that lower substrate temperature can be used. For instance, substrate temperatures of about 20 up to about 600° C. are functional.

The plasmas used in such processes comprise energy derived from a variety of sources such as electric discharges, electromagnetic fields in the radio-frequency or microwave range, lasers or particle beams. Generally preferred in most plasma deposition processes is the use of radio frequency (10 kHz $-10^2$MHz) or microwave (0.1-10 GHz) energy at moderate power densities (0 1-5 watts/cm$^2$). The specific frequency, power and pressure, however, are generally tailored to the equipment.

On the other hand, in LPCVD, the deposition chamber is maintained at a pressure of less than about (5) torr. A substrate temperatures in the range of (100 to 1200)° C. are maintained as the vaporized H-resin is passed over the heated substrate in the presence of nitrous oxide to form these coatings. Although the mechanisms for LPCVD and CVD are not clearly understood, it is postulated that the addition of energy to the vaporized H-resin induces reaction with oxygen and causes some rearrangement of the molecules so that a silicon and oxygen containing coating is formed on the substrate.

A reactive environment comprising nitrous oxide in the deposition chamber ensures the complete oxidation of the H-resin and, thereby, deposits a high purity silica coating, generally, minimizing the amount of silicon suboxides and residual Si-OC and/or Si-OH in the coatings.

Generally, the concentration of nitrous oxide in the reactor is not critical. Any effective concentration from about 0.1 to about 100 % can be used herein.

The reactive environment can additionally comprise any gaseous species generally injected into deposition chambers. For example, reactive gaseous species such as air, oxygen, ammonia, amines, etc. or inert gaseous species such as argon and helium can be used.

The process of this invention can be used to deposit desirable coatings in a wide variety of thicknesses. For instance, coatings in the range of from about a monolayer to greater than about 2-3 microns are possible. These coating may also be covered by other coatings such as further $SiO_2$ coatings. $SiO_2$/modifying ceramic oxide layers, silicon containing coatings, silicon carbon containing coatings, silicon nitrogen containing coatings, silicon nitrogen carbon containing coatings, silicon oxygen nitrogen containing coatings, and/or diamond like carbon coatings. Such coatings and their mechanism of deposition are known in the art. Many are taught in U.S. Pat. No. 4,973,526, which is incorporated herein by reference.

The choice of substrates to be coated is limited only by the need for thermal and chemical stability at the temperature and in the environment of the deposition vessel. Thus, the substrate can be, for example, glass, metal, plastic, ceramic or the like. It is particularly preferred herein, however, to coat electronic devices to provide a protective or dielectric coating.

THAT WHICH IS CLAIMED IS:

1. A method of depositing a coating containing silicon and oxygen on a substrate comprising:
   introducing a gas comprising hydrogen silsesquioxane into a deposition chamber containing the substrate and a reactive environment comprising nitrous oxide; and
   inducing reaction of the gas to form the coating.

2. The method of claim 1 wherein the hydrogen silsesquioxane comprises a sample in which greater than about 75 % of the species have a molecular weight less than about 2000.

3. The method of claim 1 wherein the hydrogen silsesquioxane comprises a sample in which greater than about 75 % of the species have a molecular weight less than about 1200.

4. The method of claim 1 wherein the hydrogen silsesquioxane comprises a sample in which greater than about 75 % of the species have a molecular weight between about 400 and about 1000.

5. The method of claim 1 wherein the hydrogen silsesquioxane is diluted in a carrier gas.

6. The method of claim 1 wherein the hydrogen silsesquioxane is induced to react by a means selected from the group consisting of chemical vapor deposition, low pressure chemical vapor deposition, subatmospheric chemical vapor deposition, plasma enhanced chemical vapor deposition, electron cyclotron resonance, and jet vapor deposition.

7. The method of claim 1 wherein the hydrogen silsesquioxane is induced to react by exposure to an elevated temperature.

8. The method of claim 7 in which the temperature is in the range of about 100°–1000° C.

9. The method of claim 1 wherein the hydrogen silsesquioxane resin is induced to react by exposure to a plasma.

10. The method of claim 9 in which the plasma comprises radio frequency energy or microwave energy.

11. The method of claim 1 wherein the deposition chamber is maintained at a pressure of less than about (5) torr and a temperature in the range of about (100° to 1200)° C.

12. The method of claim 1 wherein the deposition chamber is maintained at a pressure of less than about 1 atmosphere and a temperature in the range of about (100° to 1200)° C.

13. The method of claim 1 wherein the substrate comprises an electronic device.

* * * * *